United States Patent
Laird et al.

(10) Patent No.: US 9,143,005 B1
(45) Date of Patent: Sep. 22, 2015

(54) BACKUP ENERGY STORAGE MODULE WITH SELECTABLE CHARGE STORAGE ELEMENTS FOR PROVIDING BACKUP POWER TO A LOAD

(71) Applicant: Western Digital Technologies, Inc., Irvine, CA (US)

(72) Inventors: William K. Laird, Corona, CA (US); John R. Agness, Laguna Hills, CA (US); Henry S. Ung, Tustin, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 453 days.

(21) Appl. No.: 13/725,867

(22) Filed: Dec. 21, 2012

(51) Int. Cl.
*H02J 7/00* (2006.01)
*H02J 9/00* (2006.01)
*G11C 5/14* (2006.01)
*G06F 11/20* (2006.01)

(52) U.S. Cl.
CPC . *H02J 9/00* (2013.01); *G11C 5/141* (2013.01); *G06F 11/2015* (2013.01); *Y02B 10/72* (2013.01)

(58) Field of Classification Search
USPC .................................................. 307/64–67
See application file for complete search history.

(56) References Cited

U.S. PATENT DOCUMENTS

| 6,274,950 B1 * | 8/2001 | Gottlieb et al. ................. 307/66 |
| 8,065,562 B2 | 11/2011 | Wilson et al. |
| 8,154,258 B2 | 4/2012 | Pappas et al. |
| 2006/0080515 A1 | 4/2006 | Spiers et al. |
| 2010/0329064 A1 | 12/2010 | Wilson |
| 2011/0227416 A1 * | 9/2011 | Lecourtier ..................... 307/66 |

* cited by examiner

*Primary Examiner* — Danny Nguyen (57) ABSTRACT

A backup energy storage module is disclosed including a plurality of charge storage elements, each charge storage element operable to be charged to a backup voltage. The backup energy storage module further includes control circuitry operable to monitor a supply voltage that provides power to a load, determine when the supply voltage falls below a threshold level, select a first charge storage element to provide power to the load, determine when the backup voltage on the first charge storage element falls to a reference level, and select a second charge storage element to provide power to the load if the supply voltage remains below the threshold level.

36 Claims, 8 Drawing Sheets

BACKUP ENERGY STORAGE MODULE WITH SELECTABLE CHARGE STORAGE ELEMENTS FOR PROVIDING BACKUP POWER TO A LOAD

BACKGROUND

One or more charge storage elements (e.g., capacitors) that are charged to a backup voltage are commonly used to provide backup power to a load (e.g., solid state drive or disk drive) in case power is interrupted to the load. For example, in a solid state drive comprising a controller for controlling data operations to a non-volatile semiconductor memory (NVSM) array (i.e., reading data from or writing data to the NVSM array), one or more capacitors may be charged to a backup voltage (which can be greater than a supply voltage) to provide backup power to the solid state drive to ensure that user data is fully protected in an event of an interruption of power to the solid state drive.

DETAILED DESCRIPTION

The present disclosure is directed to a backup energy storage module including multiple charge storage elements, wherein each charge storage element is charged to a backup voltage. In an embodiment, a boost regulator is used to charge each storage element to the backup voltage. In an embodiment, the backup energy storage module includes control circuitry for monitoring a supply voltage that provides power to a load, determining when the supply voltage falls below a threshold level, and selecting a first charge storage element to provide power to the load. In an embodiment, the control circuitry determines when the backup voltage on the first charge storage element falls to a reference level and selects a second charge storage element to provide power to the load if the supply voltage remains below the threshold level. In an embodiment of the invention, after the control circuitry has selected each of the charge storage elements to independently provide power to the load and the supply voltage remains below the threshold level, the control circuitry combines the charge storage elements into a series configuration and uses the sum of any charge remaining on each of the charge storage elements to provide power to the load.

Various embodiments of the invention will now be described. These embodiments are presented by way of example only, and are not intended to limit the scope of the invention. Various omissions, substitutions and changes in the form of the modules and devices described herein may be made without departing from the spirit of the invention. To illustrate some of the embodiments, reference will now be made to the figures.

Figure 1:
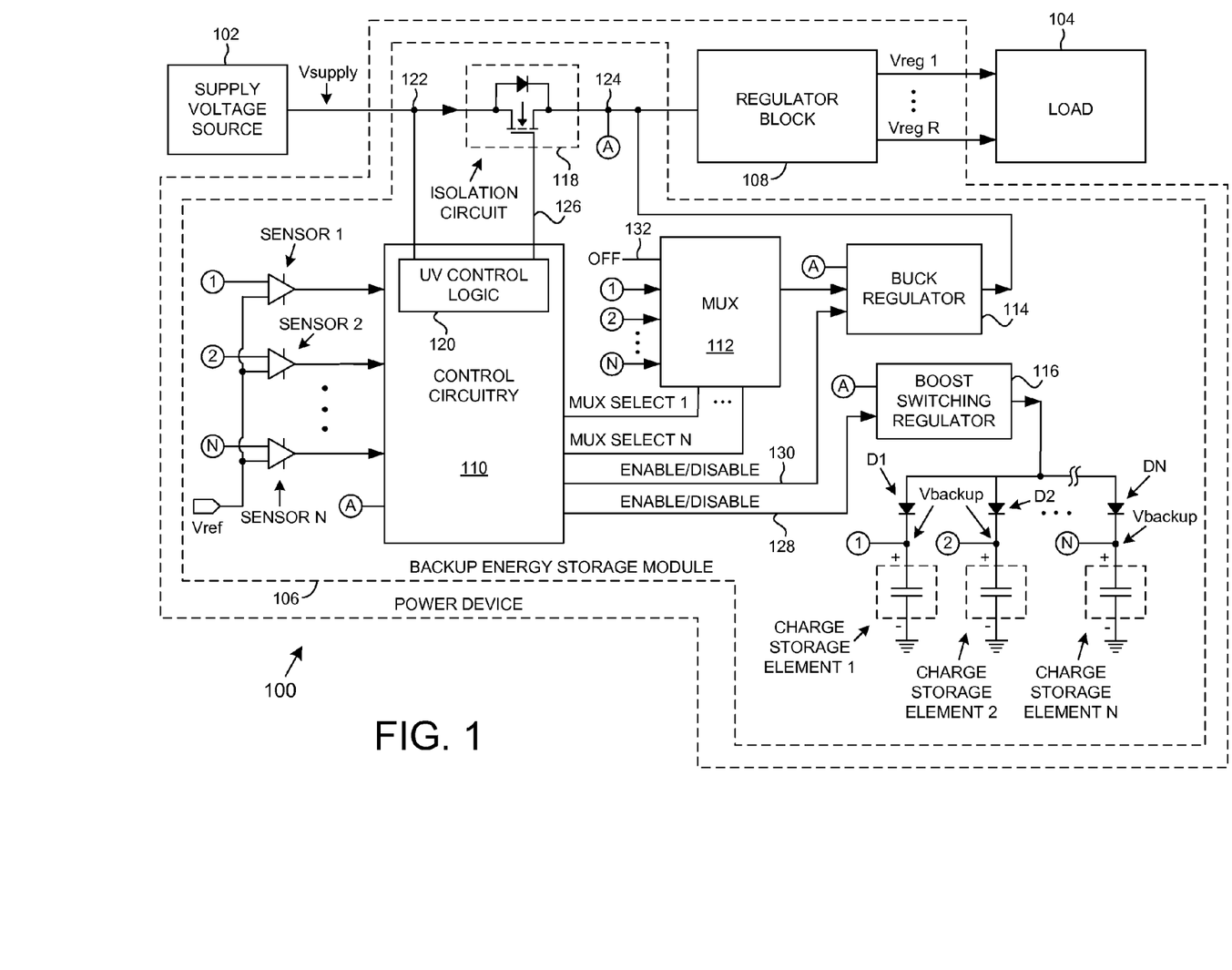
FIG. 1 shows a power device according to an embodiment of the invention wherein the power device is coupled to a supply voltage source and a load and comprises a backup energy storage module comprising a plurality of charge storage elements and control circuitry for selecting each charge storage element to power the load during a power failure mode.

FIG. 1 shows a power device 100 coupled to a supply voltage source 102 and a load 104 and comprising a backup energy storage module 106 and a regulator block 108 according to an embodiment of the invention. In the embodiment shown in FIG. 1, the backup energy storage module 106 comprises control circuitry 110, a plurality of charge storage elements 1-N, a multiplexer (MUX) 112, a buck regulator 114, a boost switching regulator (BSR) 116, an isolation circuit 118, a plurality of diodes D1-DN, and a plurality of sensors 1-N. In the embodiment shown in FIG. 1, the control circuitry 110 comprises under voltage (UV) control logic 120.

As shown in FIG. 1, the supply voltage source 102 is coupled to the power device 100 and the backup energy storage module 106 at node 122, the isolation circuit 118 is coupled between node 122 and node 124, and the regulator block 108 is coupled between node 124 and the load 104. The supply voltage source 102 is operable to output a supply voltage (Vsupply) for providing power to the power device 100 and the load 104. For example, Vsupply may be approximately equal to 5V in one embodiment. In an embodiment, the supply voltage source 102 may be located in a host system, such as a computer or other electronic device. In one embodiment, the supply voltage source 102 may be located in a standalone power supply.

The isolation circuit 118 is operable to isolate the power device 100 from the supply voltage source 102 in response to an enable/disable signal 126 from the UV control logic 120 during a power fail mode, which is triggered when Vsupply falls below a first threshold level. In the embodiment shown in FIG. 1, the isolation circuit 118 comprises a diode coupled across a Field Effect Transistor (FET), which functions as a high speed switch. However, in another embodiment, the isolation circuit 118 may comprise a high speed switch that may be implemented by using one or more electronic components other than a FET. In the embodiment in FIG. 1, the UV control logic 120 is operable to monitor Vsupply at node 122 and provide the enable/disable signal 126 to the isolation circuit 126.

During a normal operating mode (i.e., when Vsupply is greater than or equal to the first threshold level), the enable/disable signal 126 enables the isolation circuit 118, thereby allowing Vsupply to pass to node 124 to provide power to power device 100 and the load 104. When Vsupply falls below the threshold level (a power fail condition), the isolation circuit 118 is disabled by the enable/disable signal 126, thereby preventing current from flowing from the power device 100 to the supply voltage source 102. For example, in the embodiment in FIG. 1, the isolation circuit 118 is enabled by turning on the FET and disabled by turning the FET off.

In the embodiment shown in FIG. 1, during the normal operating mode, Vsupply is provided to the regulator block 108 at node 124, and the regulator block 108 is operable to provide a plurality of regulated voltages (Vreg 1-R) as required to power the load 104. For example, in an embodiment in which the load comprises a controller that controls data operations in a non-volatile semiconductor memory (NVSM) array, the regulator block 108 may provide one regulated voltage to power the controller and a different regulated voltage to power the NVSM array. In an embodiment, the regulator block 108 comprises a plurality of regulators, wherein each regulator provides one of the regulated voltages 1-R.

In the embodiment shown in FIG. 1, the boost switching regulator (BSR) 116 is coupled to the plurality of diodes D1-DN, wherein each of the diodes D1-DN is coupled to a positive terminal of one of the plurality of charge storage elements 1-N, and the negative terminal of each charge storage element is coupled to ground. In an embodiment, the BSR 116 is enabled by an enable/disable signal 128 during the normal operating mode and is operable to receive Vsupply at node 124 and charge each charge storage element 1-N to a backup voltage (Vbackup). In an embodiment, Vbackup is greater than Vsupply. In one embodiment, Vbackup may be equal to approximately 17V, for example. In an embodiment in which the BSR 116 is not used, the anode terminal of each of the diodes D1-DN is coupled to node 124, and each of the charge storage elements is charged to Vsupply. In that embodiment, Vbackup may be substantially equal to the level of Vsupply in the normal operating mode. In an embodiment, each of the charge storage elements 1-N comprises at least one capacitor.

In the embodiment shown in FIG. 1, the control circuitry 110 is coupled to MUX 112 via MUX select lines 1-N, the MUX is coupled to the buck regulator 114, and the output of the buck regulator 114 is coupled to node 124. In the embodiment in FIG. 1, Vbackup on the positive terminal of each charge storage element 1-N is coupled to a first input of one of the plurality of sensors 1-N, a reference voltage (Vref) is coupled to a second input of each of the sensors 1-N, and the output of each of the sensors 1-N is coupled to an input of the control circuitry 110. In an embodiment, Vref is selected to be a minimum voltage which the buck regulator 114 can use to provide an output voltage (Vout) at node 124 for powering the load 104 during a power fail mode. In one embodiment, Vref is substantially equal to 4V, for example. Each of the sensors 1-N is operable to provide a signal to the control circuitry 110 to indicate when Vbackup from one of the charge storage elements 1-N is substantially equal to Vref.

During the normal operating mode, which is triggered when Vsupply is greater than the first threshold level, the control circuitry 110 is operable to enable the BSR 116 via the enable/disable signal 128. When enabled, the BSR 116 is operable to receive Vsupply at node 124 and charge each of the charge storage elements 1-N to Vbackup. The control circuitry 110 is further operable to disable the buck regulator 114 via an enable/disable signal 130 and disable the MUX 112 by selecting OFF line 132 at an input to the MUX 112.

During the power fail mode, which is triggered when Vsupply falls below the first threshold level, the control circuitry 110 is operable to disable the BSR 116, enable the buck regulator 114, and provide Vbackup from one of the charge storage elements 1-N to the buck regulator 114 by selecting the appropriate input of the MUX 112. When the buck regulator 114 is enabled by the control circuitry 110, the buck regulator 114 is operable to receive Vbackup from the selected charge storage element, and provide an output voltage (Vout) at node 124 to power the regulator block 108 and the load 104. During the power fail mode, Vout at node 124 also provides power to the control circuitry 110 and the buck regulator 114.

The control circuitry 110 is further operable to determine, during the power fail mode, when the voltage on the selected charge storage element falls from Vbackup to the reference level (Vref) by receiving a signal from the sensor that is coupled to the selected charge storage element. In an embodiment, when the voltage level on the selected charge storage element falls to Vref, the charge storage element has insufficient charge to independently power the load 104. If Vsupply has not increased above the first threshold level, the control circuitry 110 is operable to select, via the MUX 112, Vbackup from a second charge storage element to provide power to the load 104 via the buck regulator 114 and the regulator block 108. When the voltage on the second selected charge storage element falls to Vref, the control circuitry 110 is operable to select Vbackup on a third charge storage element to power the load 104. The control circuitry 110 is operable to continue the above process until each of the charge storage elements 1-N has been selected to independently provide power to the load.

In an embodiment, when another charge storage element has been selected to provide power to the load 104, the control circuitry 110 is operable to prevent the previously selected charge storage element from providing power to the load 104 by deselecting it at the MUX 112. Whenever Vsupply rises above the first threshold level while a selected charge storage element is providing power to the load, the control circuitry 110 is operable to deselect the selected charge storage element at the MUX 112, disable the buck regulator 114, and enable the isolation circuit 118. For example, the control circuitry 110 may deselect the selected charge storage element by selecting the OFF line 132 at an input of the MUX 112. In an embodiment, when the voltage on the last selected charge storage element falls to Vref, the power device 100 resets to end the power fail mode.

Figure 2:
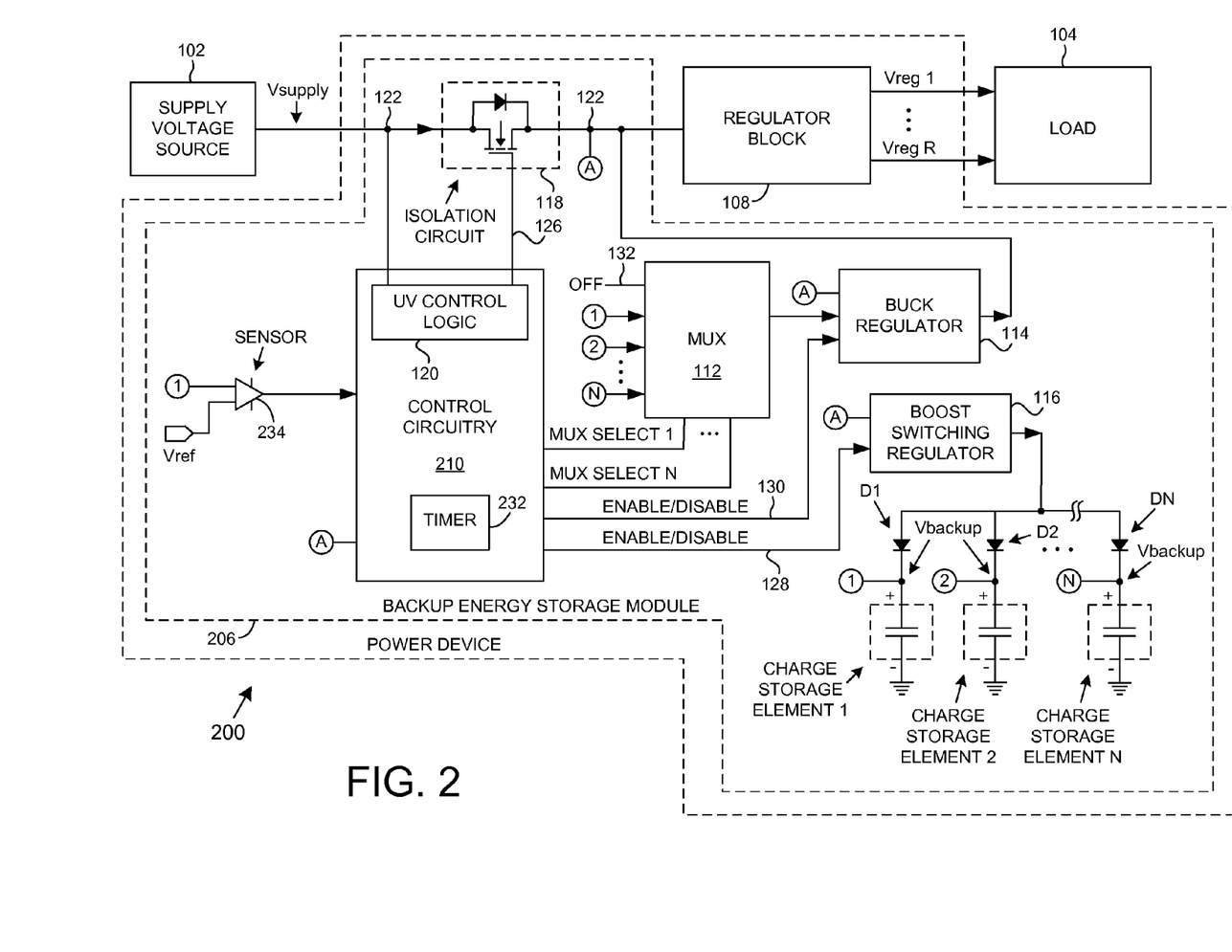
FIG. 2 shows a power device according to an embodiment of the invention wherein the power device is coupled to a supply voltage source and a load and comprises a backup energy storage module comprising a plurality of charge storage elements and control circuitry for selecting each charge storage element to power the load during a power failure mode.

FIG. 2 shows a power device 200 coupled to a supply voltage source 102 and a load 104 and comprising a backup energy storage module 206 and a regulator block 108 according to an embodiment of the invention. In the embodiment shown in FIG. 2, the backup energy storage module 206 comprises control circuitry 210, a sensor 234, a MUX 112, a buck regulator 114, a BSR 116, an isolation circuit 118, a plurality of diodes D1-DN, and a plurality of charge storage elements 1-N, and the control circuitry 210 comprises UV control logic 120 and a timer 232. In the embodiment in FIG. 2, charge storage element 1 is coupled to a first input of the sensor 234, Vref is coupled to a second input of the sensor 234, and the output of the sensor 234 is coupled to the control circuitry 210. The sensor 234 is operable to provide a signal to the control circuitry 210 to indicate when the voltage on charge storage element 1 falls from Vbackup equal to Vref.

In the embodiment in FIG. 2, when Vsupply falls below the threshold level to trigger the power fail mode, the control circuitry 210 is operable to start the timer 232, disable the BSR 116, enable the buck regulator 114, and select Vbackup on charge storage element 1 at an input of the MUX 112. When enabled, the buck regulator 114 is operable to receive Vbackup from the MUX 112 and provide Vout at node 124 to power the regulator block 108 and the load 104. In an embodiment, Vout at node 124 is approximately equal to the level of Vsupply in the normal operating mode.

In the embodiment in FIG. 2, during the power fail mode the control circuitry 210 is operable to determine when the voltage on the first selected charge storage element (charge storage element 1) falls from Vbackup to Vref by a signal received from the sensor 234, which is coupled to charge storage element 1. In the embodiment in FIG. 2, when the voltage on charge storage element 1 falls to Vref, the control circuitry 210 is operable to stop the timer 232 (which was started when Vsupply fell below the threshold level), record the elapsed time from the timer 232, and reset the timer 232. If Vsupply has not increased above the first threshold level, the control circuitry 210 is operable to select, via the MUX 112, Vbackup from a second charge storage element (charge storage element 2) to provide power to the load 104, and restart the timer 232.

In the embodiment in FIG. 2, the control circuitry 210 is operable to determine when the voltage on charge storage element 2 has fallen to Vref by using the recorded elapsed time from the timer 232 and the current elapsed time on the timer 232. In an embodiment in which there are more than two charge storage elements, the control circuitry 210 is operable to compare the recorded elapsed time to the current elapsed time on the timer 232, and when the current elapsed time is substantially equal to the recorded elapsed time, determine that the voltage on charge storage element 2 has fallen to Vref, and select another charge store element to provide power to the load 104. When the next charge storage element is selected, the timer 232 is reset, and the current elapsed time is compared to the recorded elapsed time to determine when the voltage on the currently selected charge storage element falls to Vref. The control circuitry 210 is operable to continue the above process until each of the charge storage elements 1-N has been selected to independently provide power to the load 104.

In one embodiment, the control circuitry 210 is operable to reduce the recorded elapsed time by a predetermine amount, and determine that the voltage on the selected charge storage element has fallen to Vref when the current elapsed time is substantially equal to the reduced recorded elapsed time. In an embodiment in which there are only two charge storage elements, when the current elapsed time on the timer 232 is substantially equal to the recorded elapsed time, the power device 200 resets to end the power fail mode.

Figure 3:
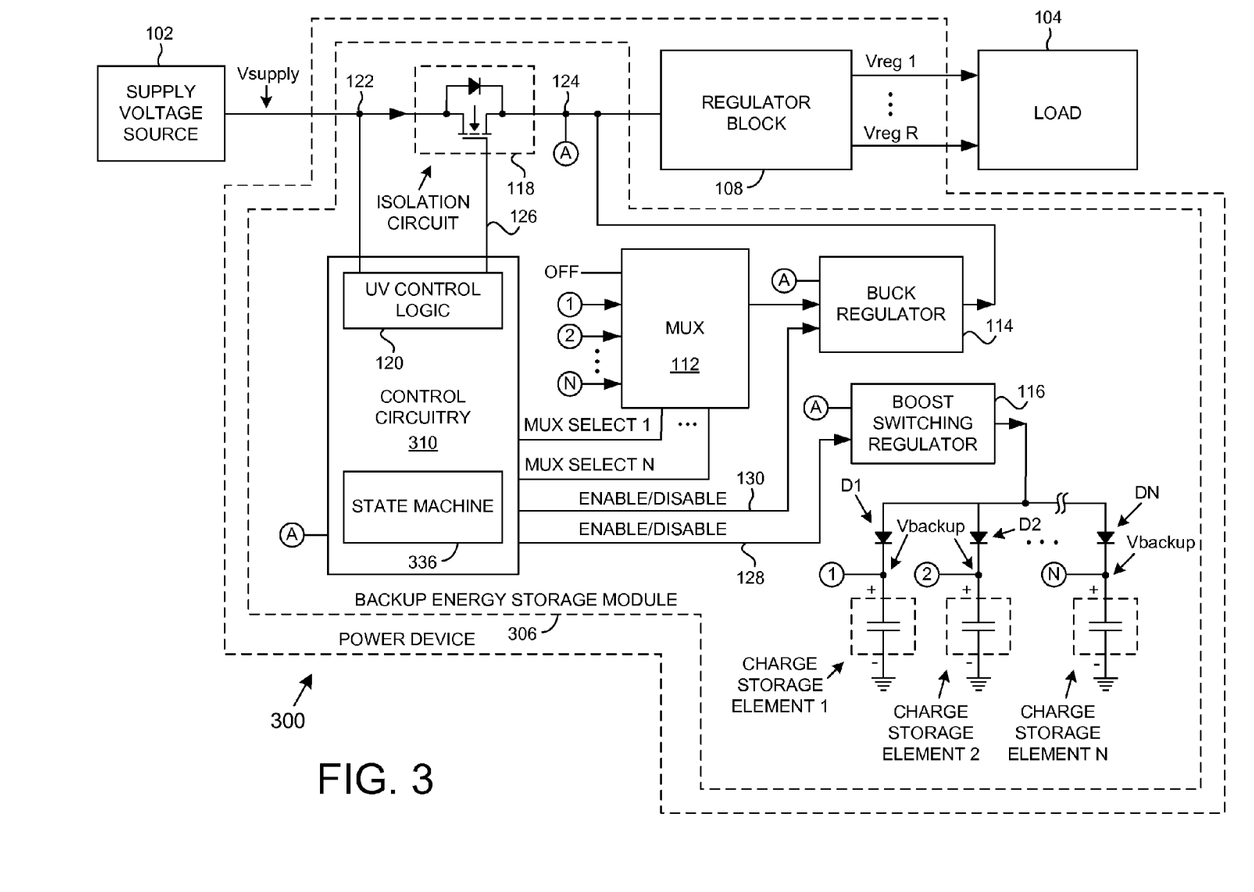
FIG. 3 shows a power device according to an embodiment of the invention wherein the power device is coupled to a supply voltage source and a load and comprises a backup energy storage module comprising a plurality of charge storage elements and control circuitry for selecting each charge storage element to power the load during a power failure mode.

FIG. 3 shows a power device 300 coupled to a supply voltage source 102 and a load 104 and comprising a backup energy storage module 306 and a regulator block 108 according to an embodiment of the invention. In the embodiment shown in FIG. 3, the backup energy storage module 306 comprises control circuitry 310, which comprises UV control logic 120 and a state machine 336, and a MUX 112, a buck regulator 114, a BSR 116, an isolation circuit 118, sensors 1-N, diodes D1-DN, and charge storage elements 1-N.

In the embodiment in FIG. 3, the state machine 336 is operable to monitor the voltage at node 124 and determine when the control circuitry 110 needs to select a charge storage element to provide power to the load 104 during the power fail mode. The state machine 336 is further operable to determine when the voltage on the selected charge storage element has fallen from Vbackup to Vref during the power fail mode, and another charge storage element needs to be selected by the control circuitry 310 to power the load 104.

During the power fail mode in one embodiment, the state machine 336 monitors the output voltage (Vout) at node 124 to determine when to select a charge storage element to provide power to the load 104 and when the selected charge storage element can no longer power the load 104 and another one needs to be selected by the control circuitry 310. In an embodiment, when Vout at node 124 falls below an upper threshold, the state machine 336 notifies the control circuitry 310 that one of the charge storage elements 1-N needs to be selected to power the load 104. In an embodiment, Vout at node 124 will increase above the upper threshold when the selected charge storage element is providing power to the load 104.

When Vout at node 124 decreases below the upper threshold, the state machine 336 notifies the control circuitry 310 that the voltage on the selected charge storage element is approaching Vref and another charge storage element needs to be selected to power the load 104. The above process continues until each charge storage element has been selected to provide power to the load 104. When the last charge storage element is powering the load 104 and Vout at node 124 drops below a lower threshold to indicate that the last charge store element has insufficient energy to power the load 104, the power device 306 resets to end the power fail mode.

Figure 4:
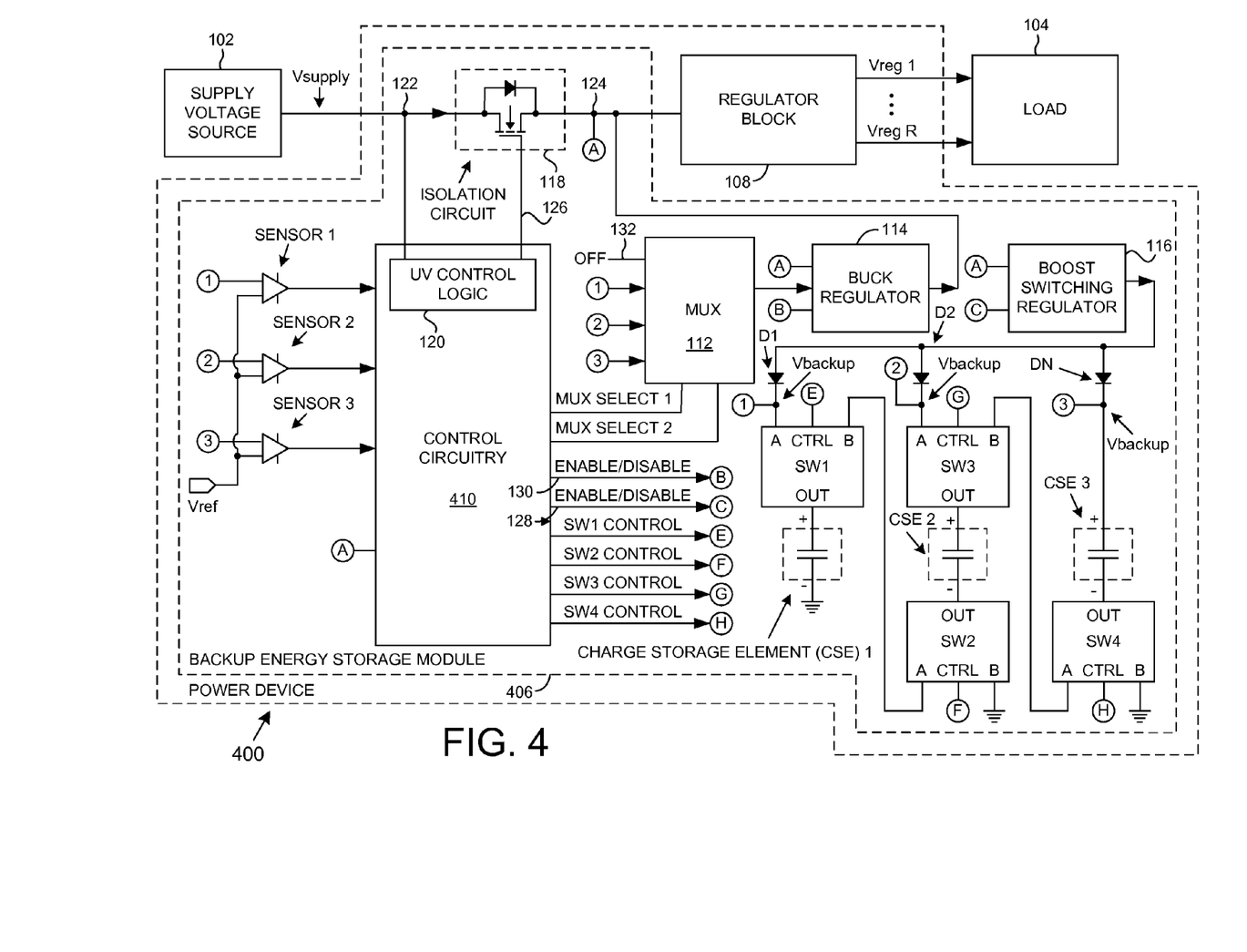
FIG. 4 shows a power device according to an embodiment of the invention wherein the power device is coupled to a supply voltage source and a load and comprises a backup energy storage module comprising a plurality of charge storage elements and control circuitry for selecting each charge storage element to power the load during a power failure mode, and wherein the control circuitry combines the charge storage elements in a series configuration to power the load when each charge storage element no longer has sufficient charge to power the load.

FIG. 4 shows a power device 400 coupled to a supply voltage source 102 and a load 104 and comprising a backup energy storage module 406 and a regulator block 108 according to an embodiment of the invention. In the embodiment shown in FIG. 4, the backup energy storage module 406 comprises control circuitry 410, MUX 112, isolation circuit 118, sensors 1-3, buck regulator 114, BSR 116, diodes D1-D3, charge storage elements 1-3, and switches SW1-SW4. In the embodiment of FIG. 4, the control terminals of SW1-SW4 are coupled to the control circuitry 410, the output of SW1 is coupled to the positive terminal of charge storage element 1, the A input of SW1 is coupled to the cathode of D1, an input of sensor 1, and an input of the MUX 412, and the B input of SW 1 is coupled to the A input of SW 2.

In the embodiment shown in FIG. 4, the B input of SW2 is coupled to ground, the output of SW2 is coupled to the negative terminal of charge storage element 2, the positive terminal of charge storage element 2 is coupled to the output of SW3, the A input of SW3 is coupled to the cathode of D2, an input of sensor 2, and an input of the MUX 112, the B input of SW3 is coupled to the A input of SW4, the B input of SW4 is coupled to ground, the output of SW4 is coupled to the negative terminal of charge storage element 3, and the positive terminal of charge storage element 3 is coupled to the cathode of D3, an input of sensor 3, and an input of the MUX 412. In the embodiment in FIG. 4, an input of sensors 1-3 is coupled to Vref. Other embodiments may include more or less than four switches and more or less than three charge storage elements.

In the embodiment in FIG. 4, during the normal operating mode the control circuitry 410 is operable to enable the BSR 116 to charge each of the charge storage elements 1-3 to the backup voltage (Vbackup) provided by the BSR 116 by switching the A input of SW 1 to the output of SW1, the B input of SW2 to the output of SW2, the A input of SW 3 to the output of SW3, and the B input of SW4 to the output of SW 4.

In the embodiment in FIG. 4, when Vsupply falls below the first threshold level to trigger the power fail mode, the control circuitry 410 is operable to disable the BSR 116, enable the buck regulator 114, and select Vbackup from charge storage element 1 at an input of the MUX 112. When enabled, the buck regulator 114 is operable to receive Vbackup from the MUX 112 and provide an output voltage (Vout) at node 124 to power the regulator block 108, the control circuitry 410, the buck regulator 114, and the load 104. In an embodiment, Vout is approximately equal to Vsupply as provided to the power device 400 in the normal operating mode.

In the embodiment in FIG. 4, the control circuitry 410 is operable to determine when the voltage on selected charge storage element 1 falls from Vbackup to Vref by a signal from sensor 1. If Vsupply remains below the first threshold level, the control circuitry 410 is operable to select, via the MUX 112, Vbackup from charge storage element 2 to provide power to the load 104 via the buck regulator 112 and the regulator block 108. If Vsupply continues to remain below the first threshold level, the control circuitry 410 selects charge storage element 3 to provide power to the load when the control circuitry 410 determines, via a signal from sensor 2, that the voltage on charge storage element 2 has fallen to Vref.

In the embodiment in FIG. 4, when the voltage on charge storage element 3 falls to Vref to indicate that charge element 3 has insufficient charge to power the load 104, and Vsupply continues to remain below the threshold level, the control circuitry 410 is operable to couple charge storage elements 1-3 in a series configuration and use the sum of any charge remaining on each of the charge storage elements 1-3 to provide power to the load 104, as well as powering the control circuitry 410, the buck regulator 114, and the regulator block 108. In the embodiment in FIG. 4, the control circuitry 410 is operable to couple charge storage elements 1-3 in the series configuration by switching, via respective SW1-SW4 control lines, the output of SW1 to its B input, the output of SW2 to its A input, the output of SW3 to its B input, and the output of SW4 to its A input.

Thus, in the series configuration of charge storage elements 1-3, the negative terminal of charge storage element 1 is coupled to ground, the positive terminal of charge storage element 1 is coupled to the negative terminal of charge storage element 2, the positive terminal of charge storage element 2 is coupled to the negative terminal of charge storage element 3, and a summation voltage (equal to the sum of the remaining voltages on each charge storage element) is provided at the positive terminal of charge storage element 3. In one embodiment, the summation voltage may be equal to approximately 12V, for example.

In the embodiment in FIG. 4, since the summation voltage is provided at the positive terminal of charge storage element 3, and the positive terminal of charge storage element 3 is coupled to an input of sensor 3 and an input of the MUX 112, the control circuitry 410 provides the summation voltage to the input of the buck regulator 114 by selecting the input of the MUX 112 corresponding to charge storage element 3. In the embodiment in FIG. 4, when the voltage at the positive terminal of charge storage element 3 falls from the summation voltage to Vref, which indicates that the series combination of charge storage elements 1-3 has insufficient energy remaining to power the load 104, the power device 400 resets to end the power fail mode.

EXAMPLE 1

A Charge Storage Element Powering a 500 mA Load for 10 ms

In this example, the charge storage element (CSE) comprises a capacitance of 1000 uF and is charged to 17V. The total energy in the charge storage element is:
Total Energy $(17V)=\frac{1}{2}CV^2=\frac{1}{2}$ 1000 uF*$(17V)^2=0.1445$ Joules (J)
If a buck regulator is used that works down to 2V, the total usable energy is:
Energy at $2V=\frac{1}{2}$ 1000 uF*$(2V)^2=0.002$ J
Total usable energy=Energy (17V)−Energy (2V)=0.1445 J−0.002 J=0.1425 J
Voltage left in the CSE after 10 ms brownout with 500 mA load:
dv=i*(dt/C)=−500 mA*(10 ms/1000 uF)=−5V
17V−5V=12V left in the CSE
Energy left in the CSE when the voltage is now 12V after 10 ms:
Energy left $(12V)=\frac{1}{2}$ 1000 uF*$(12V)^2=0.072$ J
Need to subtract the energy below 2V:
Total useable energy=Energy (12V)−Energy (2V)=0.072 J−0.002 J=0.070 J
Power left in the CSE if we discharge all the energy in 10 ms:
Power=Energy/Time=0.070 J/10 ms=7.0 W

EXAMPLE 2

Two Charge Storage Elements Powering a 500 mA Load for 10 ms

In this example, each charge storage element (CSE-1, CSE-2) comprises a capacitance of 500 uF and is charged to 17V. The total energy in CSE1 and CSE2 is:
Total Energy $(17V)=\frac{1}{2}CV^2=\frac{1}{2}$ 500 uF*$(17V)^2=0.07225$ J*2 (CSEs)=0.1445 J
If a buck regulator is used that works down to 2V, the total usable energy is:
Energy at $2V=\frac{1}{2}$ 1000 uF*$(2V)^2=0.002$ J
Total usable energy=Energy (17V)−Energy (2V)=0.1445 J−0.002 J=0.1425 J
Voltage left in CSE-1 after 10 ms brownout with 500 mA load:
dv=i*(dt/C)=−500 mA*(10 ms/500 uF)=−10V
17 v−10V=7V left in CSE-1

In this example, CSE-2 is still fully charged
Energy left in CSE-1 when the voltage is now 7V after 10 ms and the other capacitor is fully charged:
Energy left in CSE-1 (5V)=½ 500 uF*(7V)$^2$=0.01225 J
0.01225 J (CSE-1)+0.07225 J left in CSE-2=0.0845 J
Need to subtract the energy below 2V:
Total usable energy=Total Energy (12V)−(Energy (2V)*2 (capacitors)=0.0845 J−0.002 J=0.0825 J
Power left in CSE-1 and CSE-2 if we discharge all the energy in 10 ms:
Power=Energy/Time=0.0825 J/10 ms=8.25 W

EXAMPLE 3

Three Charge Storage Elements Powering a 500 mA Load for 10 ms

In this example, each charge storage element (CSE-1, CSE-2, CSE-3) comprises a capacitance of 333 uF is charged to 17V. The total energy in the charge storage elements is:
Total Energy (17V)=½ CV$^2$=½ 333 uF*(17V)$^2$=0.0481185 J*3 (CSEs)=0.1445 J
If a buck regulator is used that works down to 2V, the total usable energy is:
Energy at 2V=½ 333 uF*(2V)$^2$=0.000666 J*3 (CSEs)=0.002 J
Total usable energy=Energy (17V)−Energy (2V)=0.1445 J−0.002 J=0.1425 J
Voltage left in CSE1 after 10 ms brownout with 500 mA load:
dv=i*(dt/C)=−500 mA*(10 ms/333 uF)=−15V
17 v−15V=2V left in CSE-1
In this example, CSE-2 and CSE-3 are still fully charged
Energy left in CSE1 when the voltage is now 5V after 10 ms and CSE-2 and CSE-3 are fully charged:
Energy left=½ 333 uF*(2V)$^2$=0.000666 J
0.000666 J+0.0481185 J left in CSE-2+0.0481185 J left in CSE-3=0.0969035 J
Need to subtract the energy below 2V:
Total Energy (12V)−(Energy (2V)*3 (CSEs)=0.0969035 J−0.002 J=0.094 J
Power left in CSE1, CSE2, and CSE3 if we discharge all the energy in 10 ms:
Power=Energy/Time=0.094 J/10 ms=9.4 W Summary of Analysis of Examples 1, 2, and 3 (described above):

| Number of charge storage elements (each comprising a capacitance) | Energy left after 10 ms | Power left for 10 ms discharge |
|---|---|---|
| One charge storage element (comprising a 1000 uF capacitance) | 0.07 J | 7.0 W |
| Two charge storage elements (each comprising a 500 uF capacitance) | 0.825 J | 8.25 W |
| Three charge storage elements (each comprising a 333 uF capacitance) | 0.094 J | 9.4 W |

EXAMPLE 4

Charge Storage Element at 4V (Buck Regulator Design)

In this example, a charge storage element comprises a capacitance of 1000 uF and is coupled to a buck regulator that requires more than 4V to operate. The energy in the charge storage element at 4V that cannot be used is:
Energy Unused=½ CV$^2$=½ 1000 uF*(4V)$^2$=0.008 J
No energy can be used at 4V.

EXAMPLE 5

Two Charge Storage Elements at 4V (Buck Regulator Design)

In this example, two charge storage elements each comprise a capacitance of 500 uF and are coupled to a buck regulator that requires more than 4V to operate. The energy in the charge storage elements at 4V that cannot be used is:
Energy Unused=½ CV$^2$=½ 500 uF*(4V)$^2$=0.004 J*2 (CSEs)=0.008 J
When the voltage reaches 4V on both charge storage elements, the charge storage elements are combined in a series configuration. The total capacitance decreases by one-half (250 uF), but the total voltage increases to 8V. As a result, the series configuration provides enough voltage for use with the buck regulator that requires more than 4V to operate.
Energy available at 8V=½ 250 uF*(8V)$^2$=0.008 J
However, the energy at 4V and below is unusable.
Energy unusable at 4V=½ 250 uF*(4V)$^2$=0.002 J
Total energy usable by the series configuration=0.008 J−0.002 J=0.006 J
Percentage of series configuration that has usable energy for the buck regulator:
Original unused energy difference=0.008 J−0.006 J=0.002 J
Percentage=(0.008 J−0.002 J)/0.008 J*100=75%

EXAMPLE 6

Three Charge Storage Elements at 4V (Buck Regulator Design)

In this example, three charge storage elements each comprise a capacitance of 333 uF and are coupled to a buck regulator that requires more than 4V to operate. The energy in the charge storage elements at 4V that cannot be used is:
Energy Unused=½ CV$^2$=½ 333 uF*(4V)$^2$=0.002664 J*3 (capacitors)=0.008 J
When the voltage reaches 4V on the three charge storage elements, they are combined in a series configuration. The total capacitance decreases by one-third (111 uF), but the total voltage increases to 12V. As a result, the series configuration provides enough voltage for use with the buck regulator that requires more than 4V to operate.
Energy available at 12V=½ 111 uF*(12V)$^2$=0.008 J
However, the energy at 4V and below is unusable.
Energy unusable at 4V=½ 111 uF*(4V)$^2$=0.000888 J
Total energy usable by the series configuration=0.008 J−0.000888 J=0.007122 J
Percentage of series configuration that has usable energy for the buck regulator:
Original unused energy difference=0.008 J−0.007122 J=0.000888 J
Percentage=(0.008 J−0.000888 J)/0.008 J*100=88.9%

Summary of Analysis of Examples 4, 5, and 6 (described above):

| Number of charge storage elements (each comprising a capacitance) | Energy left at 4 V | Percentage of energy that can be used by configuring charge storage elements in series after each one has discharged to 4 V |
|---|---|---|
| One charge storage element (comprising a 1000 uF capacitance) | 0.008 J | 0% |
| Two charge storage elements (each comprising a 500 uF capacitance ) | 0.008 J | 75% |
| Three charge storage elements (each comprising a 333 uF capacitance) | 0.008 J | 88.9% |

Figure 5:
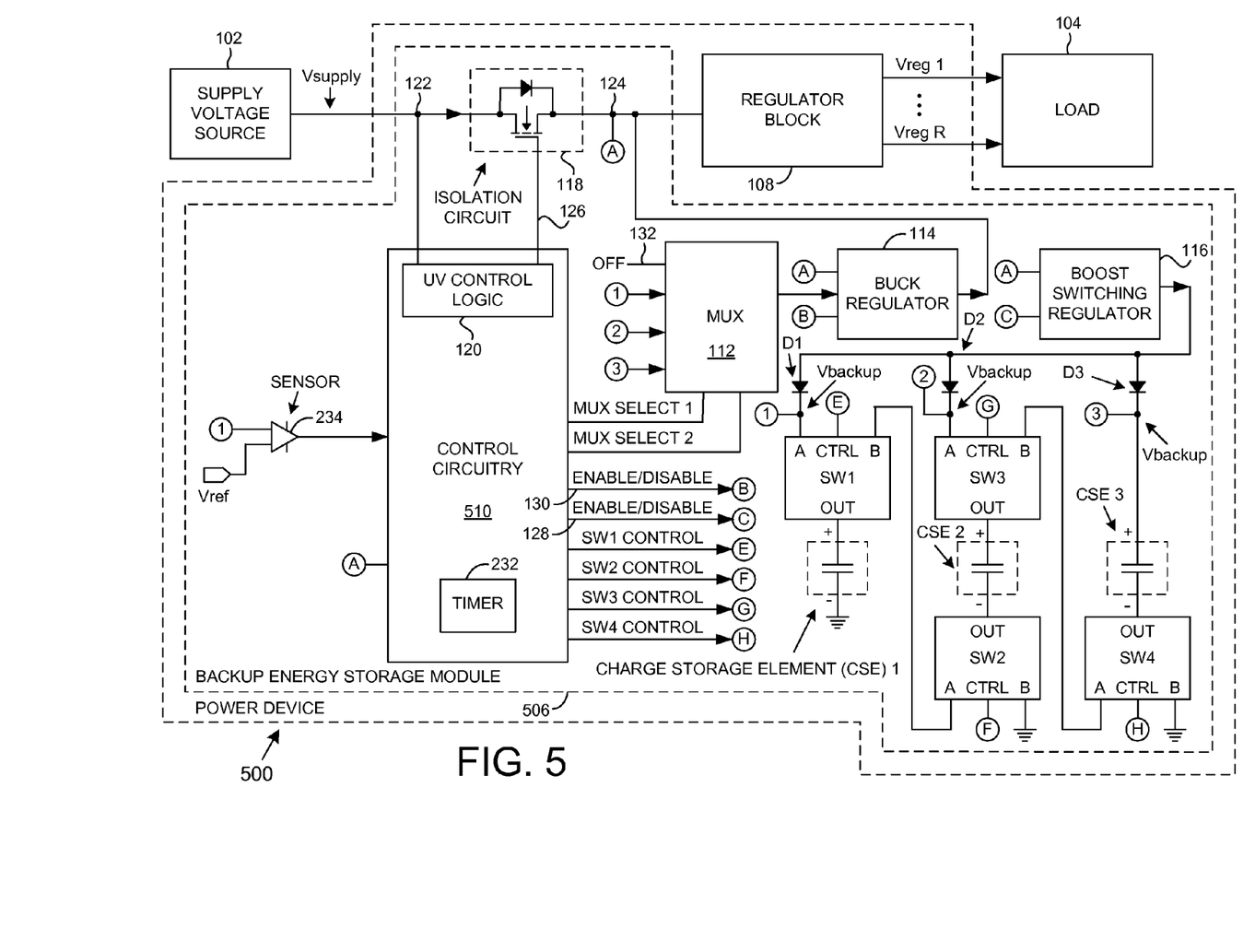
FIG. 5 shows a power device according to an embodiment of the invention wherein the power device is coupled to a supply voltage source and a load and comprises a backup energy storage module comprising a plurality of charge storage elements and control circuitry for selecting each charge storage element to power the load during a power failure mode, and wherein the control circuitry combines the charge storage elements in a series configuration to power the load when each charge storage element no longer has sufficient charge to power the load.

FIG. 5 shows a power device 500 coupled to a supply voltage source 102 and a load 104 and comprising a backup energy storage module 506 and a regulator block 108 according to an embodiment of the invention. In the embodiment shown in FIG. 5, the backup energy storage module 506 comprises control circuitry 510, a sensor 234, a regulator block 108, a MUX 112, a buck regulator 114, a BSR 116, diodes D1-D3, switches SW1-SW4, and charge storage elements 1-3, and the control circuitry 510 comprises UC control logic 120 and timer 232.

In the normal operating mode, the control circuitry 510 in the embodiment in FIG. 5 operates in a similar manner as the control circuitry 410 described above in the embodiment in FIG. 4 to enable each of the charge storage elements 1-3 to be charged to Vbackup by enabling the BSR 116 and appropriately controlling switches SW1-SW4 via respective SW1-SW4 control lines.

In the power failure mode, which is triggered when Vsupply falls below the first threshold level, the control circuitry 510 in the embodiment in FIG. 5 uses the timer 232, the sensor 234, a recorded elapsed time from the timer 232, and a current elapsed time on the timer 232 in a similar manner as described above in the embodiment in FIG. 2 to determine when the voltage on a selected charge storage element has fallen from Vbackup to Vref and another charge storage element needs to be selected to power the load 104. In the embodiment in FIG. 5, when charge storage element 3 has been selected to power the load 104 and the control circuitry 510 determines that the voltage on charge storage element 3 has fallen to Vref by comparing the current elapsed time to the recorded elapsed time as discussed above in the embodiment in FIG. 2, the control circuitry 510 is operable to combine the charge storage elements 1-3 in a series configuration and use the sum of any charge remaining on each of the charge storage elements 1-3 to provide power to the load 104, as discussed above in the embodiment in FIG. 4. In another embodiment, the backup energy storage module 506 can comprise any number of charge storage elements.

Figure 6:
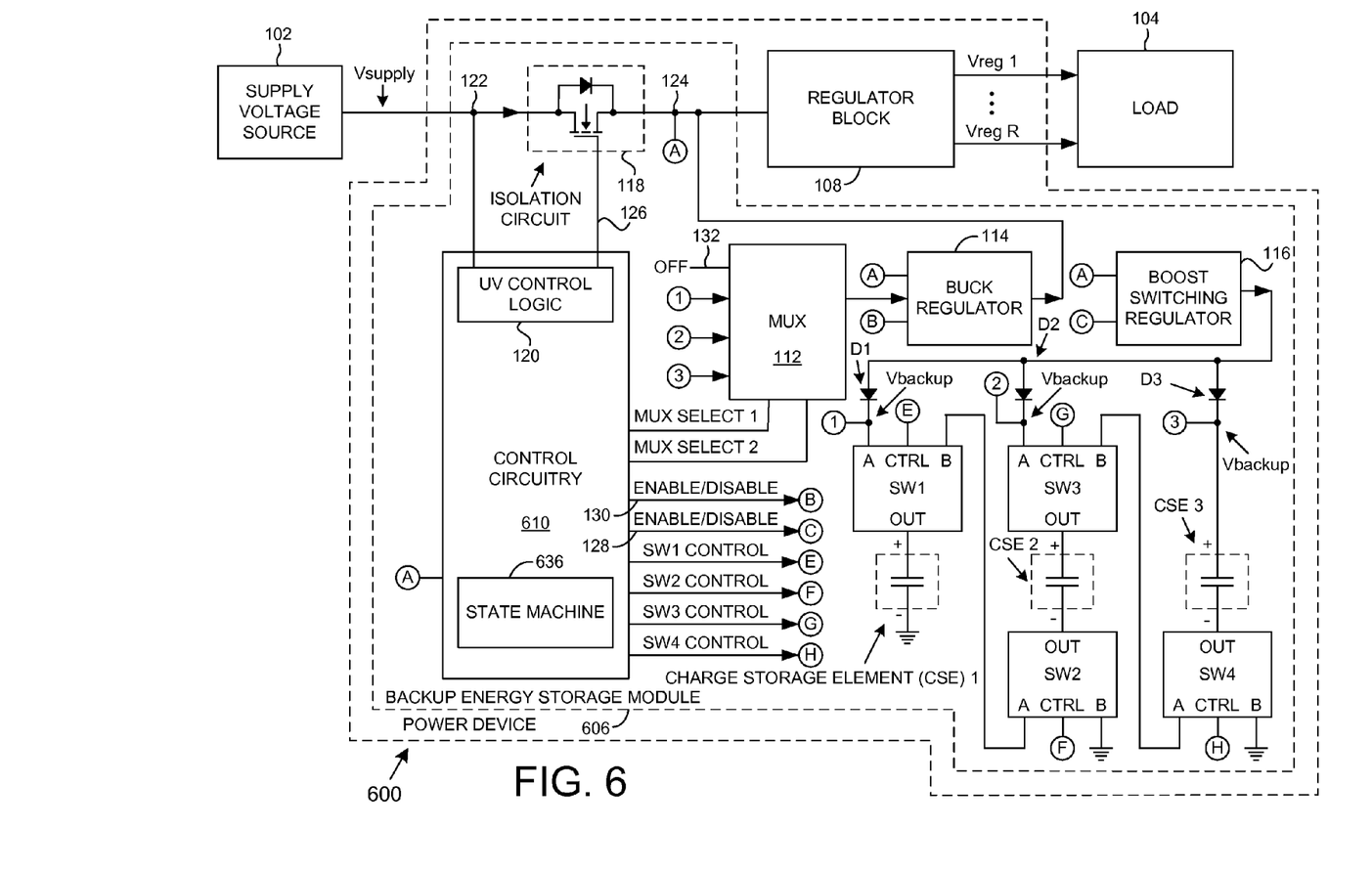
FIG. 6 shows a power device according to an embodiment of the invention wherein the power device is coupled to a supply voltage source and a load and comprises a backup energy storage module comprising a plurality of charge storage elements and control circuitry for selecting each charge storage element to power the load during a power failure mode, and wherein the control circuitry combines the charge storage elements in a series configuration to power the load when each charge storage element no longer has sufficient charge to power the load.

FIG. 6 shows a power device 600 coupled to a supply voltage source 102 and a load 104 and comprising a backup energy storage module 606 and a regulator block 108 according to an embodiment of the invention. In the embodiment shown in FIG. 6, the backup energy storage module 606 comprises control circuitry 610, a sensor 234, a regulator block 108, a MUX 112, a buck regulator 114, a BSR 116, diodes D1-D3, switches SW1-SW4, and charge storage elements 1-3, and the control circuitry 610 comprises UV control logic 120 and a state machine 636. In a similar manner as described with regard to the state machine 336 in the embodiment in FIG. 3, the state machine 636 in the embodiment in FIG. 6 is operable to monitor the output voltage (Vout) at node 124 and determine when Vout has fallen below the upper threshold and a charge storage element needs to be selected to provide power to the load 104.

In the embodiment in FIG. 6, when the last charge storage element (charge storage element 3) has been selected to power the load 104 during the power fail mode and the state machine 636 determines that Vout on node 124 has fallen below the upper threshold, the control circuitry 610 is operable to combine the charge storage elements 1-3 in a series configuration and use the sum of any charge remaining on each of the charge storage elements 1-3 to provide power to the load 104, as discussed above in the embodiment in FIG. 4.

In an embodiment, when the series configuration of charge storage elements 1-3 is selected to power the load 104 and Vout at node 124 falls below the lower threshold, the power device 600 resets to end the power fail mode. In another embodiment, the backup energy storage module 606 can comprise any number of charge storage elements.

Figure 7:
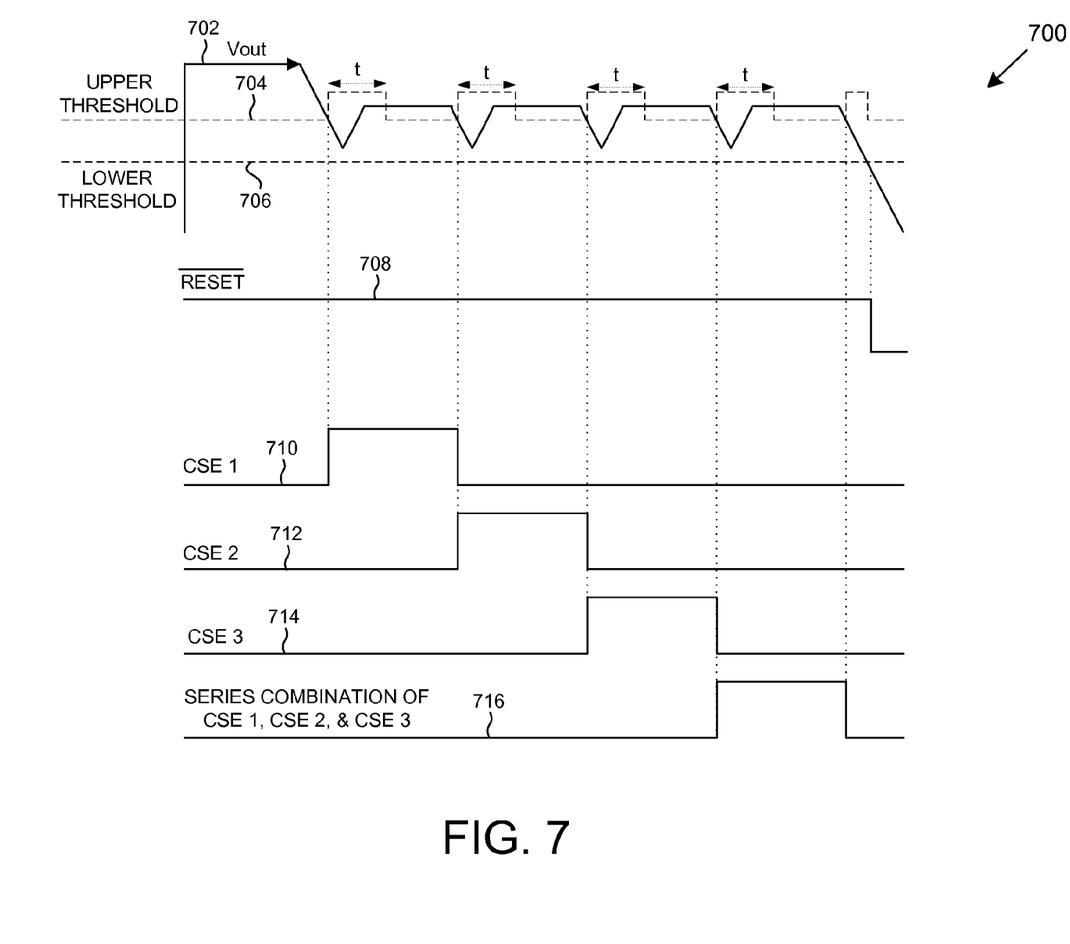
FIG. 7 shows a timing diagram illustrating the operation of a power device during a power fail mode according to an embodiment of the invention.

FIG. 7 shows a timing diagram 700 illustrating the operation of the power device 600 shown in FIG. 6 just prior to and during a power fail mode according to an embodiment of the invention. In the timing diagram 700 in FIG. 7, waveform 702 shows the output voltage (Vout) at node 124 (FIG. 6), dotted line 704 shows an upper threshold, dotted line 706 shows a lower threshold, waveform 708 shows a not reset signal (which is active low), waveform 710 shows when charge storage element (CSE) 1 is selected and deselected, waveform 712 shows when charge storage element 2 is selected and deselected, waveform 714 shows when charge storage element 3 is selected and deselected, and waveform 716 shows when a series configuration of charge storage elements 1-3 is selected and deselected. In the embodiment of the invention show in FIG. 7, the upper threshold is increased for predetermined time T (indicated by dotted line 704) when Vout at node 124 (FIG. 6) goes below the upper threshold, and decreased to its initial level after time T has elapsed. In the embodiment shown in FIG. 7, the upper threshold is increased for the predetermined time T to prevent a false indication that Vsupply (FIG. 6) has increased above the first threshold while Vout at node 124 is increasing after a charge storage element has been selected.

In the embodiment shown in FIG. 7, the state machine 636 (FIG. 6) determines that charge storage element 1 needs to be selected when Vout at node 124 first decreases below the upper threshold when Vsupply falls below the first threshold and triggering the power fail mode. After charge storage element 1 has been selected by the control circuitry 610 (FIG. 6), Vout at node 124 rises above the upper threshold during the power fail mode. When Vout falls below the upper threshold at second time, the state machine 636 determines that charge storage element 2 needs to be selected to keep Vout at node 124 above the lower threshold. When charge storage element 2 is selected by the control circuitry 610 (FIG. 6), the control circuitry 610 deselects charge storage element 1, as shown in waveform 710.

In the above process, after charge storage element 3 has been selected and Vout at node 124 decreases below the upper threshold, the state machine 636 determines that a series combination of charge storage elements 1-3 needs to be selected to keep Vout above the lower threshold. After the control circuitry 610 has selected the series combination of charge storage elements 1-3 to provide power to load 104 and Vout at node 124 falls below the lower threshold, the not reset signal shown by waveform 708 switches low and causes the power device 600 to reset and end the power fail mode.

Figure 8A:
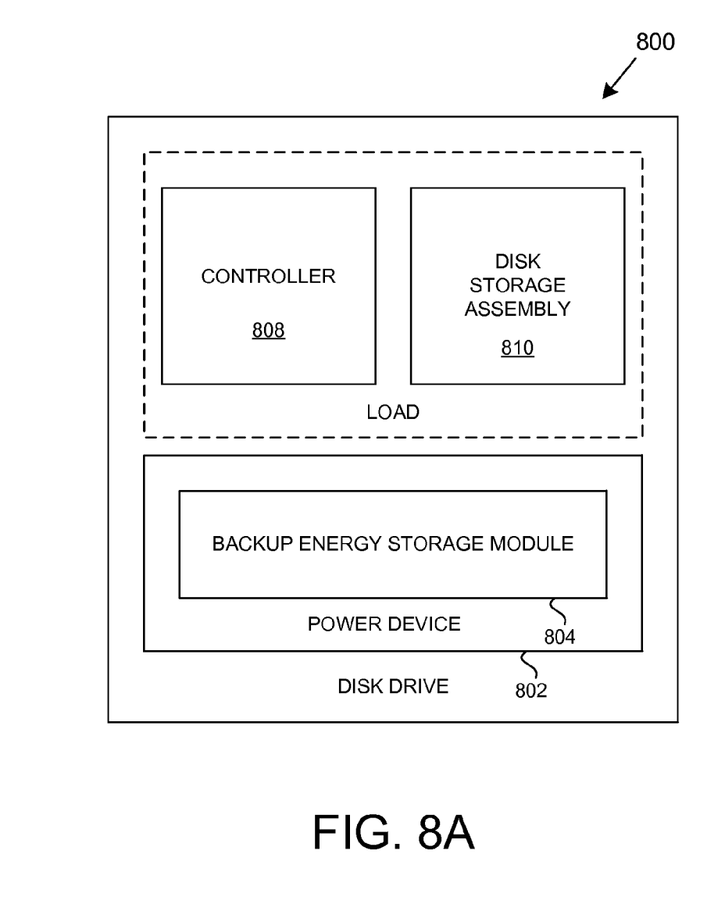
FIG. 8A shows a disk drive comprising a power device comprising a backup energy storage module according to an embodiment of the invention wherein the backup energy module comprising a plurality of charge storage elements for powering a controller and a disk storage assembly in the disk drive during a power fail mode.

FIG. 8A shows a disk drive 800 comprising a power device comprising a backup energy storage module according to an embodiment of the invention. In the embodiment shown in FIG. 8A, the disk drive 800 comprises a power device 802 comprising a backup energy storage module 804 and a load 806 comprising a controller 808 and a disk storage assembly 810. In the embodiment shown in FIG. 8A, the backup energy storage module 804 comprises control circuitry and a plurality of charge storage elements, such as the control circuitry and the charge storage elements described above in embodiments of the invention shown in FIGS. 1-6. In the embodiment in FIG. 8A, during a normal operating mode, the charge storage elements are charged to a backup voltage (Vbackup). During a power fail mode, the control circuitry is operable to select each of the charge storage elements to provide power to the load 806. In one embodiment, the control circuitry is operable to combine the charge storage elements in a series configuration to further power the load when each of the charge storage elements no longer has sufficient charge to independently power the load 806.

Figure 8B:
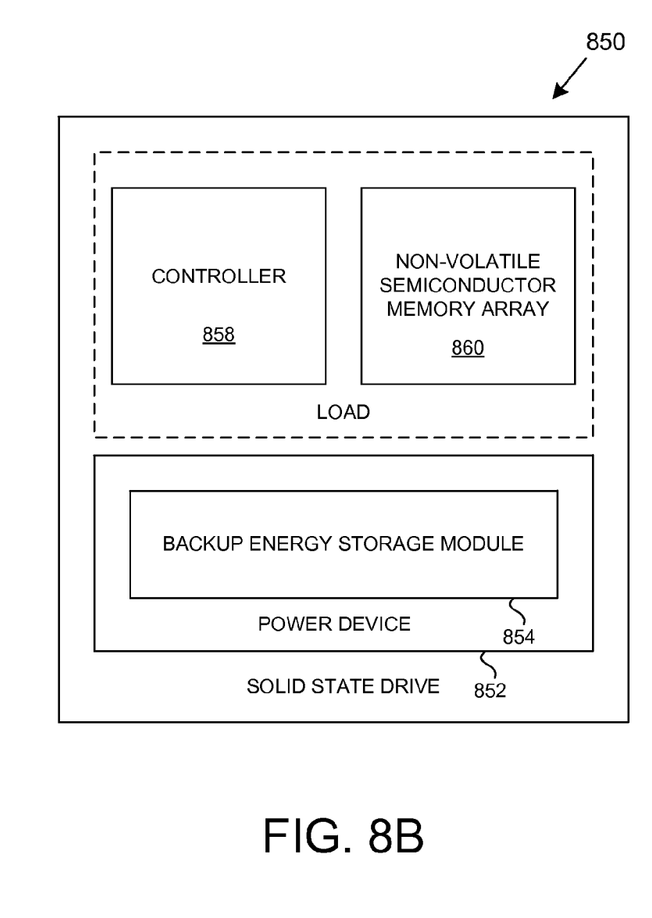
FIG. 8B shows a solid state drive comprising a power device comprising a backup energy storage module according to an embodiment of the invention wherein the backup energy module comprising a plurality of charge storage elements for powering a controller and a non-volatile semiconductor memory array in the solid state drive during a power fail mode.

FIG. 8B shows a solid state drive 850 comprising a power device comprising a backup energy storage module according to an embodiment of the invention. In the embodiment shown in FIG. 8B, the solid state drive 800 comprises a power device 852 comprising a backup energy storage module 854 and a load 856 comprising a controller 858 and a non-volatile semiconductor memory array 860. In the embodiment shown in FIG. 8B, the backup energy storage module 854 comprises control circuitry and a plurality of charge storage elements, such as the control circuitry and the charge storage elements described above in embodiments of the invention shown in FIGS. 1-6. In the embodiment in FIG. 8B, during a normal operating mode, the charge storage elements are charged to a backup voltage (Vbackup). During a power fail mode, the control circuitry is operable to select each of the charge storage elements to provide power to the load 856. In one embodiment, the control circuitry is operable to combine the charge storage elements in a series configuration to further power the load 856 when each of the charge storage elements no longer has sufficient charge to independently power the load 856.

The features and attributes of the specific embodiments disclosed above may be combined in different ways to form additional embodiments, all of which fall within the scope of the present disclosure. For example, the embodiments described in FIGS. 1-6 can be used to power electronic devices beyond those shown in FIGS. 8A-8B. Although certain embodiments have been disclosed, other embodiments that are apparent to those of ordinary skill in the art, including embodiments which do not provide all of the features and advantages set forth herein, are also within the scope of this disclosure. Accordingly, the scope of protection is defined only by the claims.

What is claimed is:

1. A backup energy storage module comprising:
   a plurality of charge storage elements, each charge storage element operable to be charged to a backup voltage; and
   control circuitry operable to:
      monitor a supply voltage that provides power to a load;
      determine when the supply voltage falls below a threshold level;
      select a first charge storage element to provide power to the load;
      determine when the backup voltage on the first charge storage element falls to a reference level; and
      select a second charge storage element to provide power to the load if the supply voltage remains below the threshold level.

2. The backup energy storage module as recited in claim 1, wherein the control circuitry is operable to prevent the first charge storage element from providing power to the load when the second charge storage element is selected.

3. The backup energy storage module as recited in claim 1, wherein the control circuitry is operable to prevent a selected charge storage element from providing power to the load if the supply voltage rises above the threshold level while the selected charge storage element is providing power to the load.

4. The backup energy storage module as recited in claim 1, further comprising a first sensor coupled to the first charge storage element, wherein the control circuitry is operable to receive a signal from the first sensor to determine when the backup voltage on the first charge storage element falls to the reference level.

5. The backup energy storage module as recited in claim 4, further comprising a second sensor coupled to the second charge storage element, wherein the control circuitry is operable to receive a signal from the second sensor to determine when the backup voltage on the second charge storage element falls to the reference level.

6. The backup energy storage module as recited in claim 4, wherein the control circuitry is operable to determine when the backup voltage on the second charge storage element falls to the reference level by determining an amount of time required for the first charge storage element to fall to the reference level.

7. The backup energy storage module as recited in claim 1, wherein the control circuitry comprises a state machine for determining when the backup voltage on the first storage element falls to the reference level.

8. The backup energy storage module as recited in claim 1, further comprising a buck regulator operable to receive the backup voltage from a selected charge storage element and provide an output voltage for providing power to the load.

9. The backup energy storage module as recited in claim 8, wherein the buck regulator is disabled whenever the supply voltage is above the threshold level.

10. The backup energy storage module as recited in claim 1, wherein, after the control circuitry has selected each of the charge storage elements to independently provide power to the load and the supply voltage remains below the threshold level, the control circuitry is operable to combine the charge storage elements into a series configuration and use the sum of any charge remaining on each of the charge storage elements to provide power to the load.

11. The backup energy storage module as recited in claim 1, further comprising a boost regulator operable to charge each of the charge storage elements to the backup voltage.

12. A disk drive comprising the energy storage module of claim 1.

13. A solid state drive comprising the energy storage module of claim 1.

14. The backup energy storage module as recited in claim 1, wherein the load comprises a non-volatile semiconductor memory array.

15. The backup energy storage module as recited in claim 1, wherein the load comprises a controller for controlling a data operation in a disk drive.

16. The backup energy storage module as recited in claim 11, wherein a diode is coupled between each charge storage element and the boost regulator.

17. The backup energy storage module as recited in claim 1, wherein the backup voltage is greater than the supply voltage.

18. The backup energy storage module as recited in claim 1, wherein each charge storage element comprises at least one capacitor.

19. A power device comprising:
a regulator block operable to receive a supply voltage and provide power to a load:
a backup energy storage module comprising:
    a plurality of charge storage elements, each charge storage element operable to be charged to a backup voltage; and
    control circuitry operable to:
      monitor the supply voltage;
      detect when the supply voltage falls below a threshold level;
      select a first charge storage element to provide power to the load;
      detect when the backup voltage on the first charge storage element falls to a reference level; and
      select a second charge storage element to provide power to the load if the supply voltage remains below the threshold level.

20. The power device as recited in claim 19, wherein the control circuitry is operable to prevent the first charge storage element from providing power to the load when the second charge storage element is selected.

21. The power device as recited in claim 19, wherein the control circuitry is operable to prevent a selected charge storage element from providing power to the load if the supply voltage rises above the threshold level while the selected charge storage element is providing power to the load.

22. The power device as recited in claim 19, wherein the backup energy storage module further comprises a first sensor coupled to the first charge storage element, and wherein the control circuitry is operable to receive a signal from the first sensor to determine when the backup voltage on the first charge storage element falls to the reference level.

23. The power device as recited in claim 22, wherein backup energy storage module further comprises a second sensor coupled to the second charge storage element, and wherein the control circuitry is operable to receive a signal from the second sensor to determine when the backup voltage on the second charge storage element falls to the reference level.

24. The power device as recited in claim 22, wherein the control circuitry is operable to determine when the backup voltage on the second charge storage element falls to the reference level by determining an amount of time required for the first charge storage element to fall to the reference level.

25. The power device as recited in claim 19, wherein the control circuitry comprises a state machine for determining when the backup voltage on the first storage element falls to the reference level.

26. The power device as recited in claim 19, wherein the backup energy storage module further comprises a buck regulator operable to receive the backup voltage from a selected charge storage element and provide an output voltage to regulator block to power the load.

27. The power device as recited in claim 26, wherein the buck regulator is disabled whenever the supply voltage is above the threshold level.

28. The power device as recited in claim 19, wherein, after the control circuitry has selected each of the charge storage elements to independently provide power to the load and the supply voltage remains below the threshold level, the control circuitry is operable to combine the charge storage elements into a series configuration and use a sum of any charge remaining on each of the charge storage elements to provide power to the load.

29. The power device as recited in claim 19, wherein the backup energy storage module further comprises a boost regulator operable to charge each of the charge storage elements to the backup voltage.

30. A disk drive comprising the power device of claim 19.

31. A solid state drive comprising the power device of claim 19.

32. The power device as recited in claim 19, wherein the load comprises a non-volatile semiconductor memory array.

33. The power device as recited in claim 19, wherein the load comprises a controller for controlling a data operation in a disk drive.

34. The power device as recited in claim 29, wherein a diode is coupled between each charge storage element and the boost regulator.

35. The power device as recited in claim 19, wherein the backup voltage is greater than the supply voltage.

36. The power device as recited in claim 19, wherein each charge storage element comprises at least one capacitor.

* * * * *